United States Patent
Huang

(10) Patent No.: US 11,804,806 B2
(45) Date of Patent: Oct. 31, 2023

(54) CHARGE-STEERING AMPLIFIER CIRCUIT AND CONTROL METHOD THEREOF

(71) Applicant: REALTEK SEMICONDUCTOR CORPORATION, Hsinchu (TW)

(72) Inventor: Shih-Hsiung Huang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 29 days.

(21) Appl. No.: 17/720,786

(22) Filed: Apr. 14, 2022

(65) Prior Publication Data

US 2023/0043730 A1 Feb. 9, 2023

(30) Foreign Application Priority Data

Aug. 4, 2021 (TW) ................... 110128641

(51) Int. Cl.
*H03F 1/32* (2006.01)
*H03F 3/45* (2006.01)

(52) U.S. Cl.
CPC ....... *H03F 1/3211* (2013.01); *H03F 3/45269* (2013.01)

(58) Field of Classification Search
CPC .............. H03F 1/3211; H03F 3/45269; H03F 2203/45634; H03F 3/45237; H03F 2203/45461; H03F 3/45183; H03F 3/45632; H03F 2203/45551; H03F 3/45475
USPC ............................................ 330/252–261, 9
See application file for complete search history.

(56) References Cited

U.S. PATENT DOCUMENTS

| 6,031,480 | A | * | 2/2000 | Soenen .................. H03K 5/249 341/161 |
| 10,084,412 | B2 | | 9/2018 | Lei |
| 10,594,264 | B2 | | 3/2020 | Hsieh et al. |
| 2016/0276991 | A1 | | 9/2016 | Lin |

FOREIGN PATENT DOCUMENTS

CN 110661499 A 1/2020

OTHER PUBLICATIONS

Razavi et al. "Charge Steering: A Low-Power Design Paradigm" 2013, pp. 1-8, Proceedings of the IEEE 2013 Custom Integrated Circuits Conference, IEEE.

(Continued)

*Primary Examiner* — Hieu P Nguyen
(74) *Attorney, Agent, or Firm* — WPAT. P.C

(57) ABSTRACT

A charge-steering amplifier circuit and a control method thereof are provided. The charge-steering amplifier circuit is used for amplifying a differential input signal and includes a sample-and-hold circuit, a charge-steering amplifier, a reference voltage generation circuit, and a switch circuit. The sample-and-hold circuit is configured to sample the differential input signal to generate first and second sampled signals. The charge-steering amplifier has a first input terminal, a second input terminal, a first output terminal, and a second output terminal. The first and second input terminals receive the first and second sampled signals, respectively. The reference voltage generation circuit is configured to generate a reference voltage according to the differential input signal. The switch circuit is configured to couple the reference voltage to the first output terminal and the second output terminal.

7 Claims, 13 Drawing Sheets

FIG. 2

(56) References Cited

OTHER PUBLICATIONS

OA letter of a counterpart TW application (appl. No. 110128640) mailed on Dec. 27, 2021. Summary of the OA letter: Claim(s) 1-2 is/are rejected under Patent Law Article 22(2) as being unpatentable over reference 1 (CN 110661499 A) and reference 2 (US 2016/0276991 A1). Claim correspondence between the TW counterpart application and the Instant US application: Claims 1-10 in the TW counterpart application correspond to claims 1-3, 6, 9, 11, 12, 13, 16 and 19 in the instant US application, respectively.

* cited by examiner

CHARGE-STEERING AMPLIFIER CIRCUIT AND CONTROL METHOD THEREOF

BACKGROUND OF THE INVENTION

1. Field of the Invention

The present invention generally relates to charge-steering amplifiers, and, more particularly, to amplifier circuits embodied by charge-steering amplifiers.

2. Description of Related Art

FIG. 1 is a circuit diagram of a conventional charge-steering amplifier. The charge-steering amplifier (a.k.a. a dynamic amplifier) 100 mainly comprises a transistor 110 and a transistor 120 and further includes a switch 130, a switch 140, a switch 150, a switch 160, a capacitor 170, a capacitor 180, and a capacitor 190. These components are connected in a way that is shown in FIG. 1. The charge-steering amplifier 100 operates alternately in a reset phase (in which the switch 130, the switch 140, and the switch 160 are turned on, and the switch 150 is turned off, so that the capacitor 170 and the capacitor 180 charge and the capacitor 190 discharges) and an amplification phase (in which the switch 130, the switch 140, and the switch 160 are turned off, and the switch 150 is turned on, so that the capacitor 170 and the capacitor 180 discharge and the capacitor 190 charges). In the amplification phase, the charge-steering amplifier 100 amplifies the differential input signal Vi (which is inputted from the input terminal N1 and input terminal N2) and generates an output signal Vo (which is outputted from the output terminal N3 and output terminal N4). The operational details of the charge-steering amplifier 100 are known to people having ordinary skill in the art and thus omitted for brevity.

However, the susceptibility of the transistor 110 and transistor 120 to the perturbation on the common-mode voltage of the differential input signal Vi degrades the performance of the charge-steering amplifier 100, resulting in a reduced effective number of bits (ENOB) (i.e., reduced linearity of gain).

SUMMARY OF THE INVENTION

In view of the issues of the prior art, an object of the present invention is to provide charge-steering amplifier circuits and the control methods thereof, so as to make an improvement to the prior art.

According to one aspect of the present invention, a charge-steering amplifier circuit for amplifying a differential input signal is provided. The charge-steering amplifier circuit includes a sample-and-hold circuit, a charge-steering amplifier, a reference voltage generation circuit, and a switch circuit. The sample-and-hold circuit is configured to sample the differential input signal to generate a first sampled signal and a second sampled signal. The charge-steering amplifier is coupled to the sample-and-hold circuit and has a first input terminal, a second input terminal, a first output terminal, and a second output terminal. The first input terminal receives the first sampled signal, and the second input terminal receives the second sampled signal. The reference voltage generation circuit is configured to generate a reference voltage according to the differential input signal. The reference voltage is an operation result of a common-mode voltage of the differential input signal and a direct current (DC) voltage. The switch circuit is coupled to the charge-steering amplifier and the reference voltage generation circuit and configured to couple the reference voltage to the first output terminal and the second output terminal.

According to another aspect of the present invention, a control method of a charge-steering amplifier circuit is provided. The charge-steering amplifier circuit includes a charge-steering amplifier and a sample-and-hold circuit. The charge-steering amplifier circuit operates in a reset phase or an amplification phase. The charge-steering amplifier performs an amplification operation on a first sampled signal and a second sampled signal in the amplification phase. The method includes the following steps: obtaining a common-mode voltage of a differential input signal in the reset phase; providing the common-mode voltage and a DC voltage to an output terminal of the charge-steering amplifier in the reset phase; using the sample-and-hold circuit to sample the differential input signal to generate the first sampled signal and the second sampled signal in the reset phase; and inputting the first sampled signal and the second sampled signal to the charge-steering amplifier in the amplification phase.

According to still another aspect of the present invention, a charge-steering amplifier circuit for amplifying a differential input signal is provided. The charge-steering amplifier circuit includes a sample-and-hold circuit, a charge-steering amplifier, a common-mode voltage generation circuit, and a switch circuit. The sample-and-hold circuit is configured to sample the differential input signal to generate a first sampled signal and a second sampled signal. The charge-steering amplifier is coupled to the sample-and-hold circuit and includes a first input terminal, a second input terminal, a first output terminal, a second output terminal, a first switch, a second switch, a third switch, a fourth switch, a first load capacitor, and a second load capacitor. The first input terminal receives the first sampled signal. The second input terminal receives the second sampled signal. The first load capacitor has a first end and a second end; the first end is coupled to the first output terminal through the first switch and coupled to a first reference voltage through the second switch. The second load capacitor has a third end and a fourth end; the third end is coupled to the second output terminal through the third switch and coupled to the first reference voltage through the fourth switch. The common-mode voltage generation circuit is configured to generate a common-mode voltage of the differential input signal according to the differential input signal. The switch circuit is coupled to the charge-steering amplifier and the common-mode voltage generation circuit and configured to couple the second end and the fourth end to the common-mode voltage or a second reference voltage.

According to still another aspect of the present invention, a control method of a charge-steering amplifier circuit is provided. The charge-steering amplifier circuit includes a charge-steering amplifier and a sample-and-hold circuit. The charge-steering amplifier circuit operates in a reset phase or an amplification phase. The charge-steering amplifier performs an amplification operation on a first sampled signal and a second sampled signal in the amplification phase. The method includes the following steps: obtaining a common-mode voltage of a differential input signal in the reset phase; coupling two ends of a load capacitor of the charge-steering amplifier to a first reference voltage and a second reference voltage respectively in the reset phase; using the sample-and-hold circuit to sample the differential input signal to generate the first sampled signal and the second sampled signal in the reset phase; inputting the first sampled signal and the second sampled signal to the charge-steering amplifier in the amplification phase; and providing in the amplification phase the common-mode voltage to one end of the load capacitor, which end is not coupled to an output terminal of the charge-steering amplifier.

According to the present invention, the charge-steering amplifier circuits and the control methods thereof can reduce the negative impacts of the common-mode voltage perturbation. Therefore, the performance of the charge-steering amplifier circuit of the present invention is better than that of the conventional technology.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be interpreted accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes charge-steering amplifier circuits and the control methods thereof. On account of that some or all elements of the charge-steering amplifier circuits could be known, the detail of such elements is omitted provided that such detail has little to do with the features of this disclosure, and that this omission nowhere dissatisfies the specification and enablement requirements. A person having ordinary skill in the art can choose components or steps equivalent to those described in this specification to carry out the present invention, which means that the scope of this invention is not limited to the embodiments in the specification.

Figure 1:
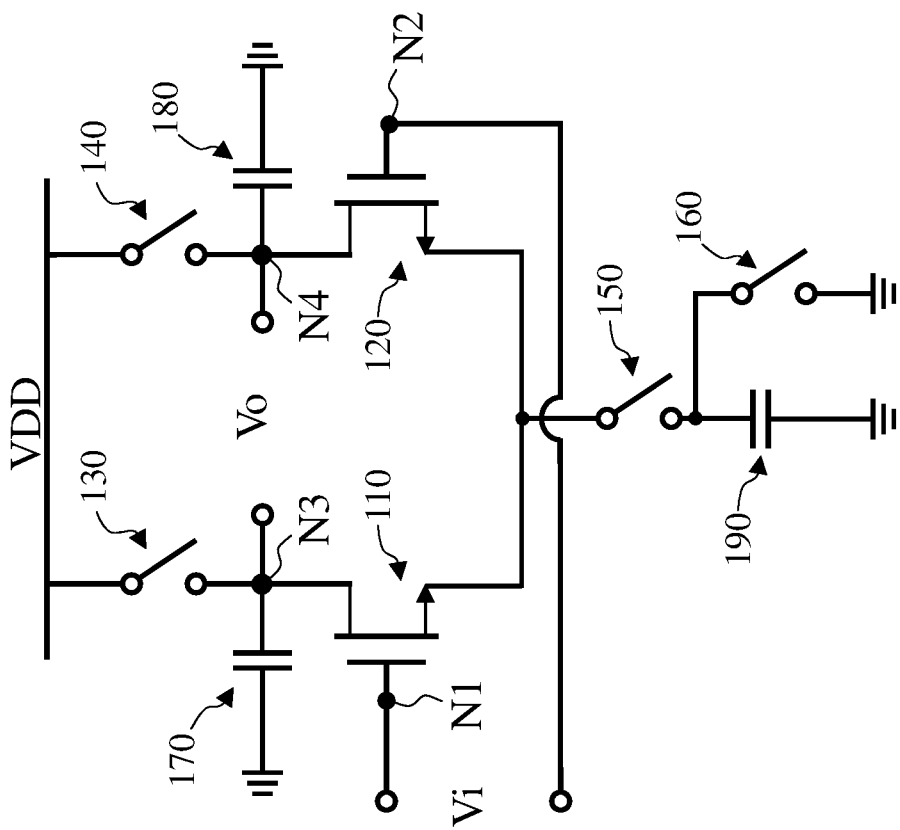
FIG. 1 illustrates a circuit diagram of a conventional charge-steering amplifier.
Figure 2:
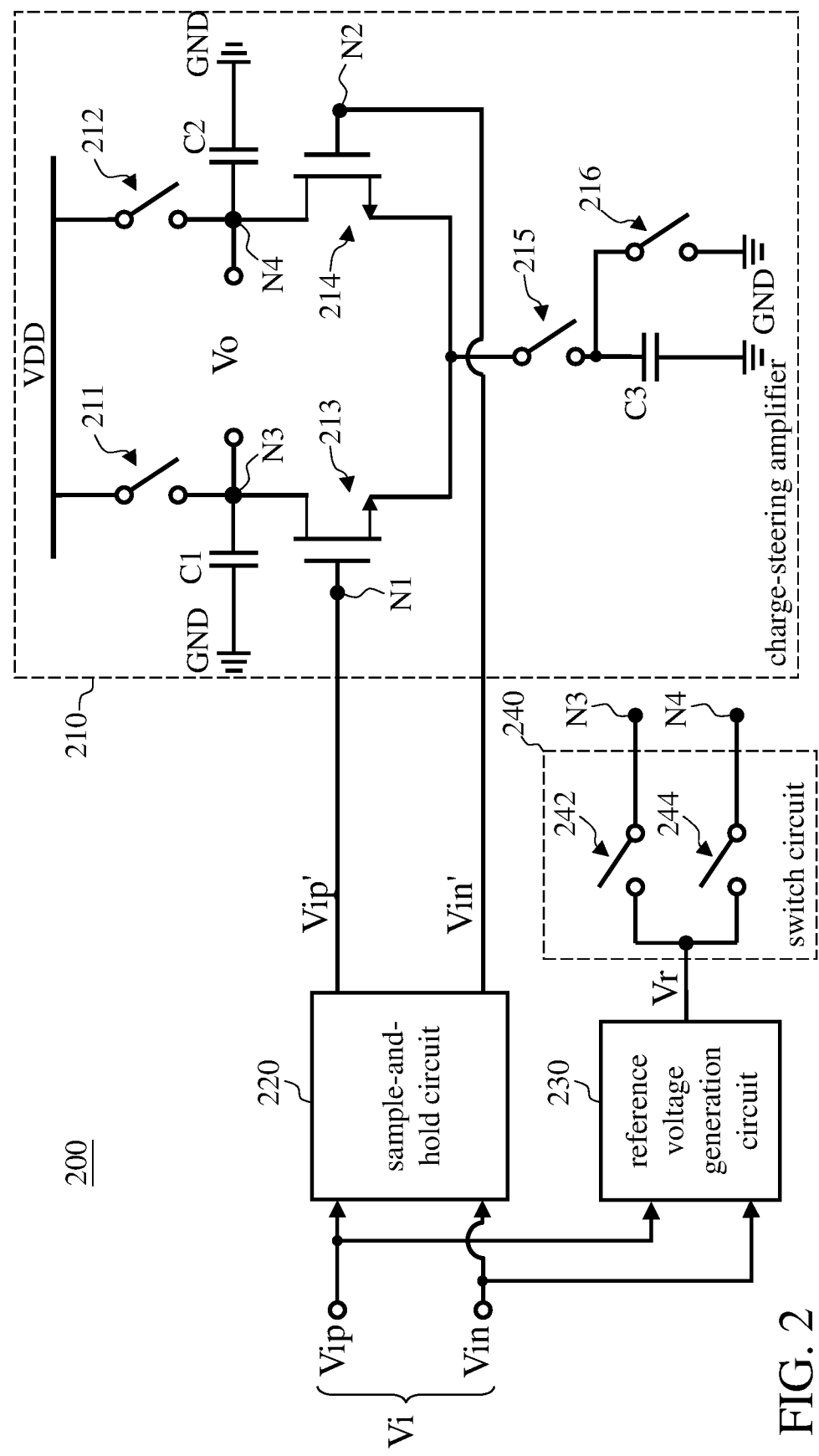
FIG. 2 illustrates a functional block diagram of a charge-steering amplifier circuit according to an embodiment of the present invention.

FIG. 2 is a functional block diagram of a charge-steering amplifier circuit according to an embodiment of the present invention. The charge-steering amplifier circuit 200 includes a charge-steering amplifier 210, a sample-and-hold circuit 220, a reference voltage generation circuit 230, and a switch circuit 240. The charge-steering amplifier circuit 200 is configured to amplify the differential input signal Vi (including the input signal Vip and the input signal Vin), and the amplified signal (i.e., the output signal Vo) is outputted from the output terminals (including the output terminal N3 and the output terminal N4) of the charge-steering amplifier 210. The sample-and-hold circuit 220 is configured to sample the input signal Vip and the input signal Vin and generate the sampled signal Vip' and the sampled signal Vin'. The sample-and-hold circuit 220 is known to people having ordinary skill in the art, and its detail is thus omitted for brevity. The sampled signal Vip' and the sampled signal Vin' are respectively received by the input terminal N1 and the input terminal N2 of the charge-steering amplifier 210. The reference voltage generation circuit 230 generates the reference voltage Vr according to the differential input signal Vi. The switch circuit 240 (including the switch 242 and the switch 244) is coupled between the charge-steering amplifier 210 and the reference voltage generation circuit 230 and configured to couple the reference voltage Vr to the output terminal N3 and the output terminal N4 of the charge-steering amplifier 210. The charge-steering amplifier 210 includes a switch 211, a switch 212, a transistor 213, a transistor 214, a switch 215, a switch 216, a capacitor C1, a capacitor C2, and a capacitor C3. The capacitor C1 and the capacitor C2 are the load capacitors of the charge-steering amplifier 210. The capacitor C1 is coupled or electrically connected between the output terminal N3 and the ground level GND, and the capacitor C2 is coupled or electrically connected between the output terminal N4 and the ground level GND. VDD is the power supply voltage. The operating principles of the charge-steering amplifier 210 are known to people having ordinary skill in the art and thus omitted for brevity. In the embodiment of FIG. 2, the transistor 213 and the transistor 214 are the N-channel Metal-Oxide-Semiconductor Field-Effect Transistors (MOSFETs) (hereinafter referred to as NMOS transistors), the input terminal N1 and the input terminal N2 are the gates of the transistor 213 and the transistor 214, respectively, and the output terminal N3 and the output terminal N4 are the drains of the transistor 213 and the transistor 214, respectively. In other words, the switch circuit 240 couples the reference voltage Vr to the drains of the transistor 213 and the transistor 214 (i.e., one end of the capacitor C1 and one end of the capacitor C2).

Figure 3:
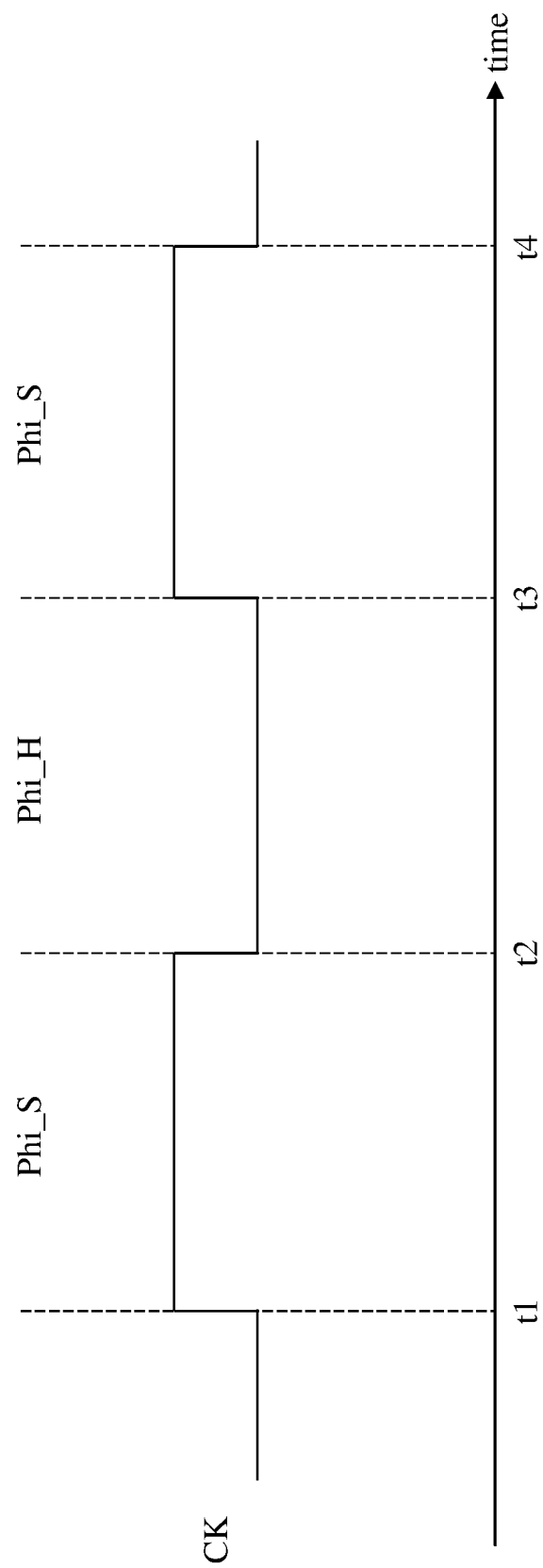
FIG. 3 illustrates the timing diagram of the charge-steering amplifier circuit of FIG. 2 according to an embodiment.

FIG. 3 shows the timing diagram of the charge-steering amplifier circuit of FIG. 2 according to an embodiment. FIG. 3 shows that when the clock CK is at the first level (e.g., high level), the charge-steering amplifier circuit 200 operates in the reset phase Phi_S (e.g., between the time point t1 and the time point t2, and between the time point t3 and the time point t4), and when the clock CK is at the second level (e.g., low level), the charge-steering amplifier circuit 200 operates in the amplification phase Phi_H (e.g., between the time point t2 and the time point t3). In other words, the charge-steering amplifier circuit 200 operates alternately in the reset phase Phi_S and the amplification phase Phi_H.

Figure 4A:
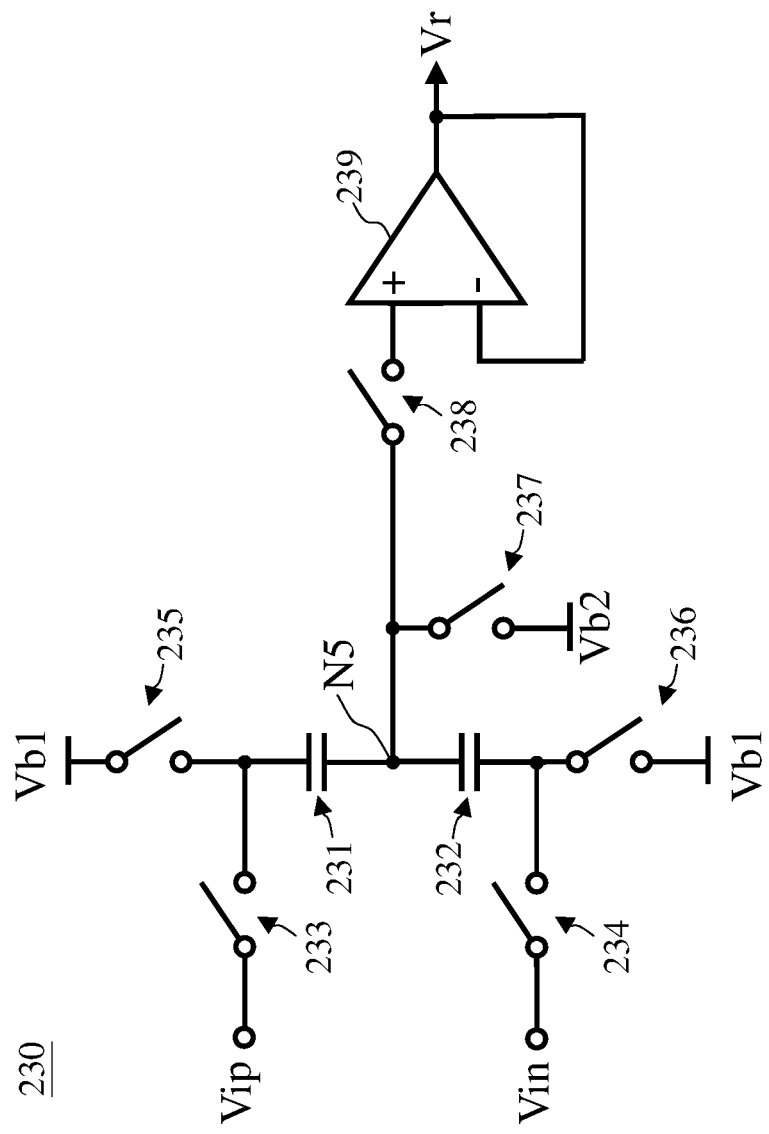
FIGS. 4A-4C illustrate the circuit diagram of a reference voltage generation circuit according to an embodiment.
Figure 4B:
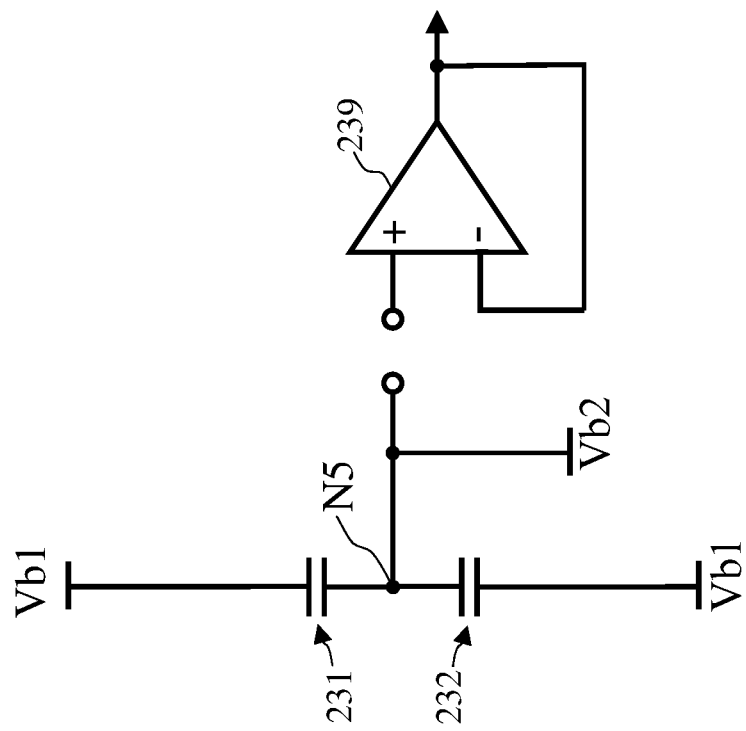
Figure 4C:
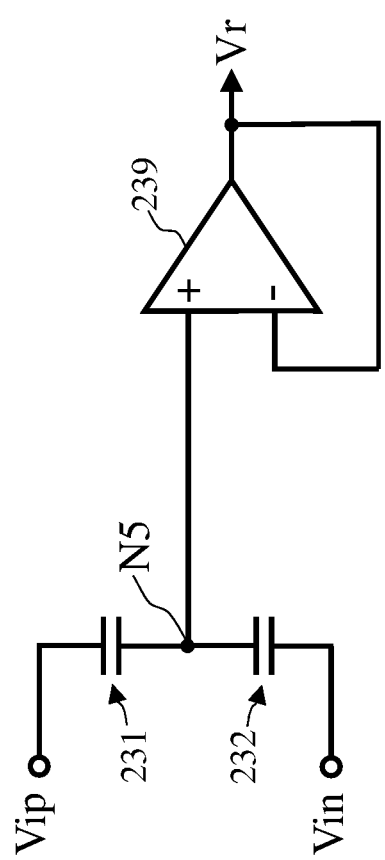

FIGS. 4A-4C show the circuit diagram of the reference voltage generation circuit 230 according to an embodiment.

As shown in FIG. 4A, the reference voltage generation circuit 230 includes a capacitor 231, a capacitor 232, a switch 233, a switch 234, a switch 235, a switch 236, a switch 237, a switch 238, and a buffer unit 239 which, in this example, is embodied by, but not limited to, an operational amplifier. In the amplification phase Phi_H, the switch 233, the switch 234, and the switch 238 are turned off, and the switch 235, the switch 236, and the switch 237 are turned on, forming the circuit shown in FIG. 4B, in which the buffer unit 239 is idle. When the amplification phase Phi_H ends, both the voltage across the capacitor 231 and the voltage across the capacitor 232 are the difference between the voltage Vb1 and the voltage Vb2. In the reset phase Phi_S, the switch 233, the switch 234, and the switch 238 are turned on, and the switch 235, the switch 236, and the switch 237 are turned off, forming a circuit shown in FIG. 4C, in which the voltage at the node N5 is the sum of the common-mode voltage Vcm of the differential input signal Vi and the difference between the voltage Vb1 and the voltage Vb2. In other words, the reference voltage Vr (=Vcm+Vb2−Vb1) outputted by the reference voltage generation circuit 230 in the reset phase Phi_S is the operation result of the common-mode voltage Vcm and a direct current (DC) voltage (Vb2−Vb1), that is to say, the reference voltage Vr is related to the common-mode voltage Vcm of the differential input signal Vi. In some embodiments, the voltage Vb1 is equal to the voltage Vb2, namely, the DC voltage is zero.

Figure 5:
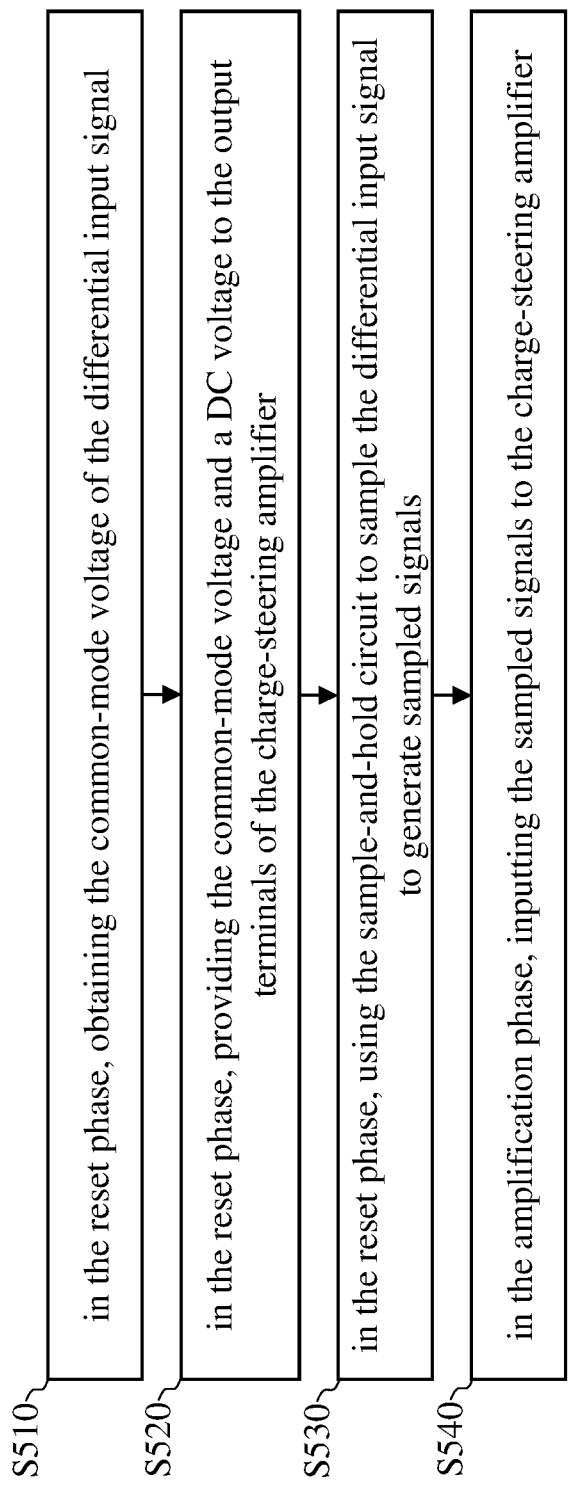
FIG. 5 illustrates a flowchart of the control method of the charge-steering amplifier circuit according to an embodiment of the present invention.

FIG. 5 shows a flowchart of the control method of the charge-steering amplifier circuit according to an embodiment of the present invention. The control method includes the following steps.

Step S510: In the reset phase Phi_S, the common-mode voltage Vcm of the differential input signal Vi is obtained. In some embodiments, in step S510, the common-mode voltage Vcm of the differential input signal Vi can be obtained by using the reference voltage generation circuit 230 of FIG. 4A.

Step S520: In the reset phase Phi_S, the common-mode voltage Vcm and a DC voltage are provided to the output terminals of the charge-steering amplifier. For example, as shown in FIG. 2, the output terminals of the charge-steering amplifier 210 include the output terminal N3 and the output terminal N4, which are the drains of the transistor 213 and the transistor 214, respectively, which are also one end of the capacitor C1 and one end of the capacitor C2, respectively. In some embodiments, the DC voltage is the difference between the voltage Vb2 and the voltage Vb1 in FIG. 4A (which difference may be positive, negative, or zero). Step S520 can use the switch circuit 240 of FIG. 2 to provide the reference voltage Vr to the output terminal N3 and the output terminal N4 (i.e., the drains of the transistor 213 and the transistor 214) of the charge-steering amplifier 210. In other words, the switch 242 and the switch 244 are turned on in the reset phase Phi_S and turned off in the amplification phase Phi_H.

Step S530: In the reset phase Phi_S, the sample-and-hold circuit is used to sample the differential input signal to generate sampled signals. For example, as shown in FIG. 2, in step S530, the sample-and-hold circuit 220 can be used to sample the differential input signal Vi to generate the sampled signal Vip' and the sampled signal Vin'.

Step S540: In the amplification phase Phi_H, the sampled signals are inputted to the charge-steering amplifier. For example, as shown in FIG. 2, the charge-steering amplifier 210 receives the sampled signal Vip' and the sampled signal Vin' through the input terminal N1 and the input terminal N2 in the amplification phase Phi_H, and amplifies the sampled signal Vip' and the sampled signal Vin' in the amplification phase Phi_H to generate the output signal Vo.

Figure 6:
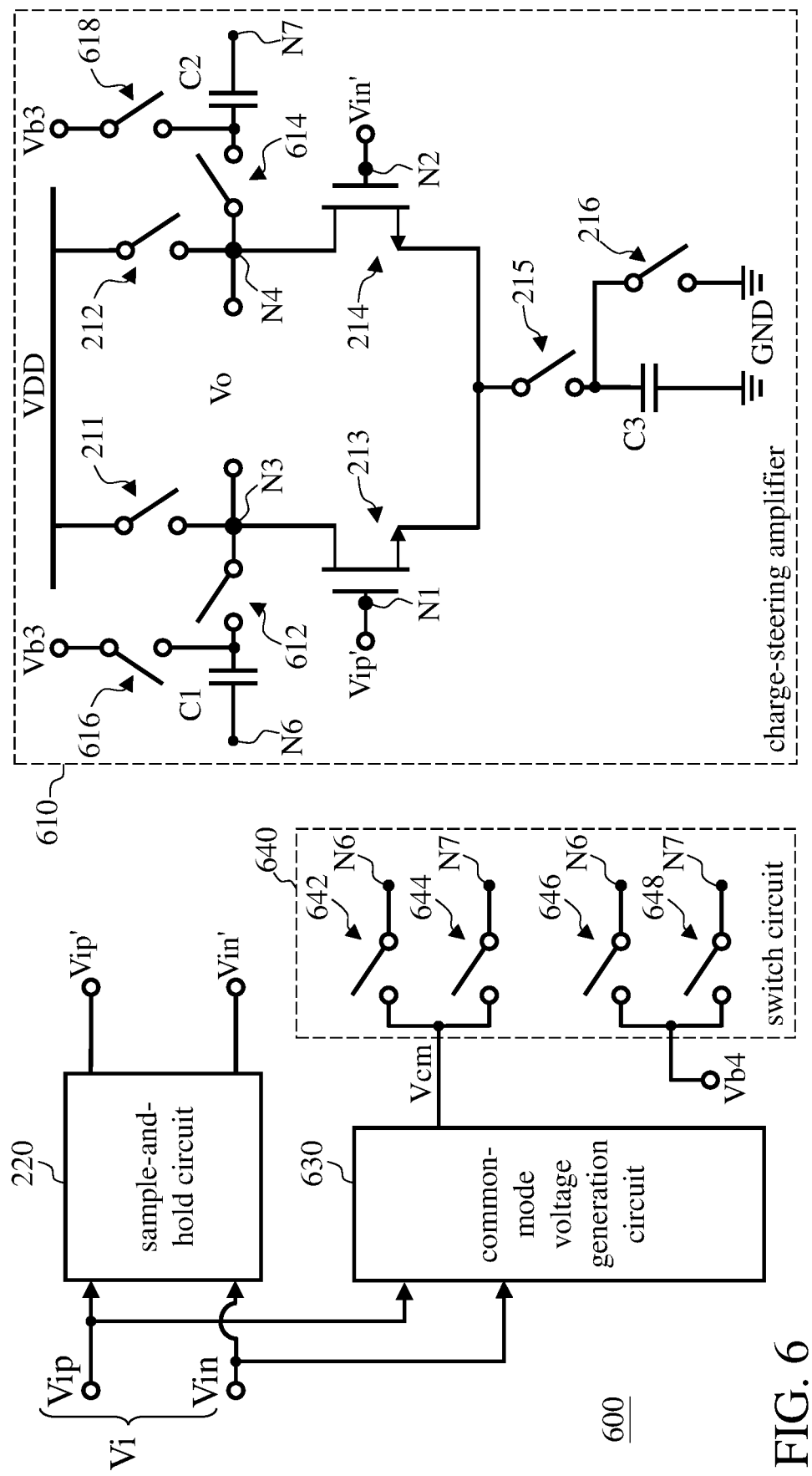
FIG. 6 illustrates a functional block diagram of a charge-steering amplifier circuit according to another embodiment of the present invention.

FIG. 6 is a functional block diagram of a charge-steering amplifier circuit according to another embodiment of the present invention. The charge-steering amplifier circuit 600 includes a charge-steering amplifier 610, the sample-and-hold circuit 220, a common-mode voltage generation circuit 630, and a switch circuit 640 (including a switch 642, a switch 644, a switch 646, and a switch 648).

The common-mode voltage generation circuit 630 is configured to generate the common-mode voltage Vcm according to the input signal Vip and the input signal Vin. In some embodiments, the common-mode voltage generation circuit 630 can be embodied by the circuit of FIG. 4A, with the reference voltage Vr being the common-mode voltage Vcm when the voltage Vb1 is equal to the voltage Vb2.

The charge-steering amplifier 610 is similar to the charge-steering amplifier 210, except that the charge-steering amplifier 610 further includes a switch 612, a switch 614, a switch 616, and a switch 618. The first end of the capacitor C1 is coupled to the output terminal N3 through the switch 612 and coupled to the reference voltage Vb3 through the switch 616; the second end of the capacitor C1 (i.e., the node N6) is coupled to the common-mode voltage generation circuit 630 through the switch 642 and coupled to the reference voltage Vb4 through the switch 646. The first end of the capacitor C2 is coupled to the output terminal N4 through the switch 614 and coupled to the reference voltage Vb3 through the switch 618; the second end of the capacitor C2 (i.e., the node N7) is coupled to the common-mode voltage generation circuit 630 through the switch 644 and coupled to the reference voltage Vb4 through the switch 648. The reference voltage Vb3 and the reference voltage Vb4 may be equal or different.

Figure 7:
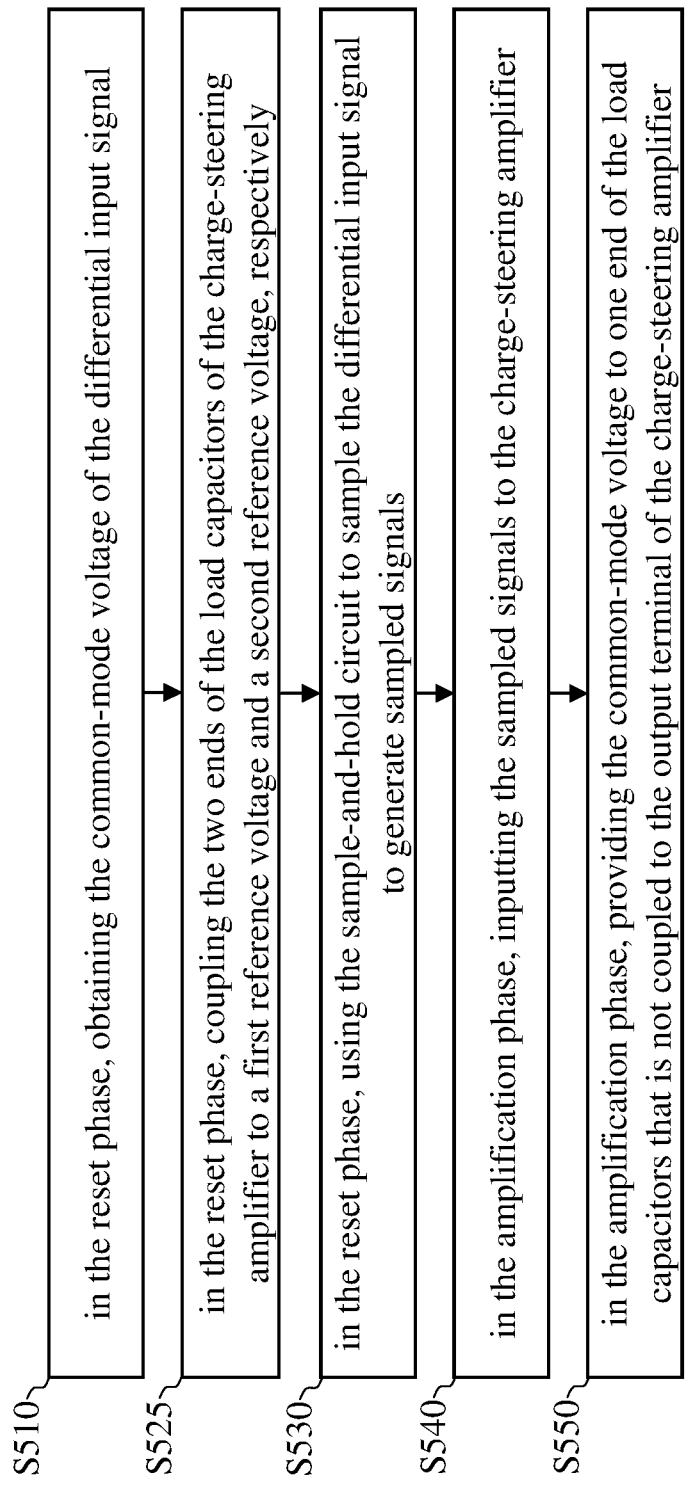
FIG. 7 illustrates a flowchart of the control method of the charge-steering amplifier circuit according to another embodiment of the present invention.

FIG. 7 shows a flowchart of the control method of the charge-steering amplifier circuit according to another embodiment of the present invention. The control method includes steps S510, S525, S530, S540, and S550. Steps S510, S530, and S540 have been discussed above and thus omitted herein for brevity.

Step S525: In the reset phase Phi_S, the two ends of the load capacitors (i.e., the capacitor C1 and the capacitor C2) of the charge-steering amplifier are respectively coupled to the reference voltage Vb3 and the reference voltage Vb4. Step S525 can be carried out by using the switch 612, the switch 614, the switch 616, the switch 618, and the switch circuit 640 of FIG. 6. More specifically, in the reset phase Phi_S, the switch 616, the switch 618, the switch 646, and the switch 648 are turned on, while the switch 612, the switch 614, the switch 642, and the switch 644 are turned off.

Step S550: In the amplification phase Phi_H, the common-mode voltage Vcm is provided to one end of the load capacitors that is not coupled to the output terminal of the charge-steering amplifier 610. More specifically, step S550 provides the common-mode voltage Vcm to the node N6 and the node N7 in the amplification phase Phi_H; that is to say, in the amplification phase Phi_H, the capacitor C1 and the capacitor C2 receive the common-mode voltage Vcm through the switch 642 and the switch 644, respectively. Step S550 can be carried out by using the switch 612, the switch 614, the switch 616, the switch 618, and the switch circuit 640 of FIG. 6. More specifically, in the amplification phase Phi_H, the switch 612, the switch 614, the switch 642, and the switch 644 are turned on, while the switch 616, the switch 618, the switch 646, and the switch 648 are turned off.

Likewise, the embodiments of FIGS. 6 and 7 enable the output terminals of the charge-steering amplifier circuit 600 to track the common-mode voltage of the differential input signal.

The above method can greatly improve the performance of the charge-steering amplifier circuit. For example, some simulations show that the charge-steering amplifier circuit that does not track the common-mode voltage of the differential input signal at its output terminals has a gain of about 4.2-6.08, whereas the charge-steering amplifier circuit that tracks the common-mode voltage of the differential input signal at its output terminals (i.e., the present invention) has a gain of about 5.73-6.08. In other words, the gain of the charge-steering amplifier circuit of the present invention is more stable and linear (i.e., less susceptible to the differential input signals). In addition, the above advantages become more obvious (with the gain range changing from 3.0-6.02 to 5.62-5.97) as the threshold voltage of the transistors becomes smaller (e.g., in different manufacturing processes). However, applying the common-mode voltage of the differential input signal to other terminals of the transistor cannot achieve the same effect.

Figure 8:
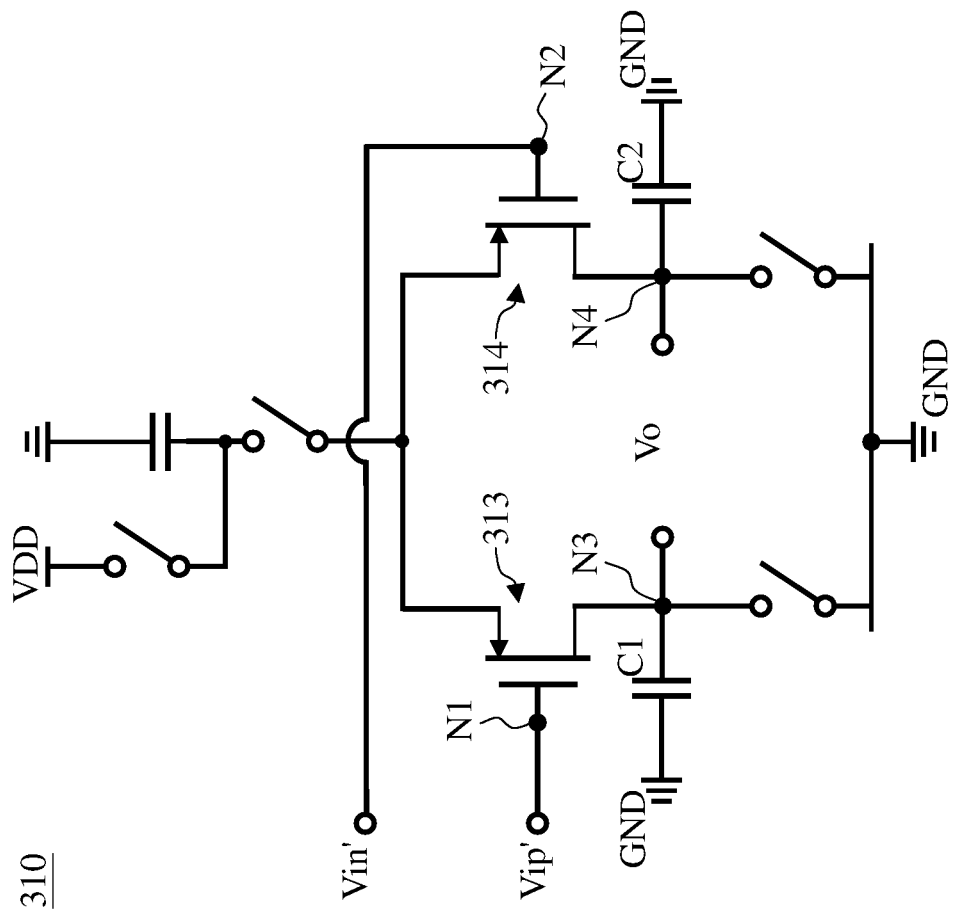
FIG. 8 illustrates a circuit diagram of a charge-steering amplifier according to another embodiment.
Figure 9:
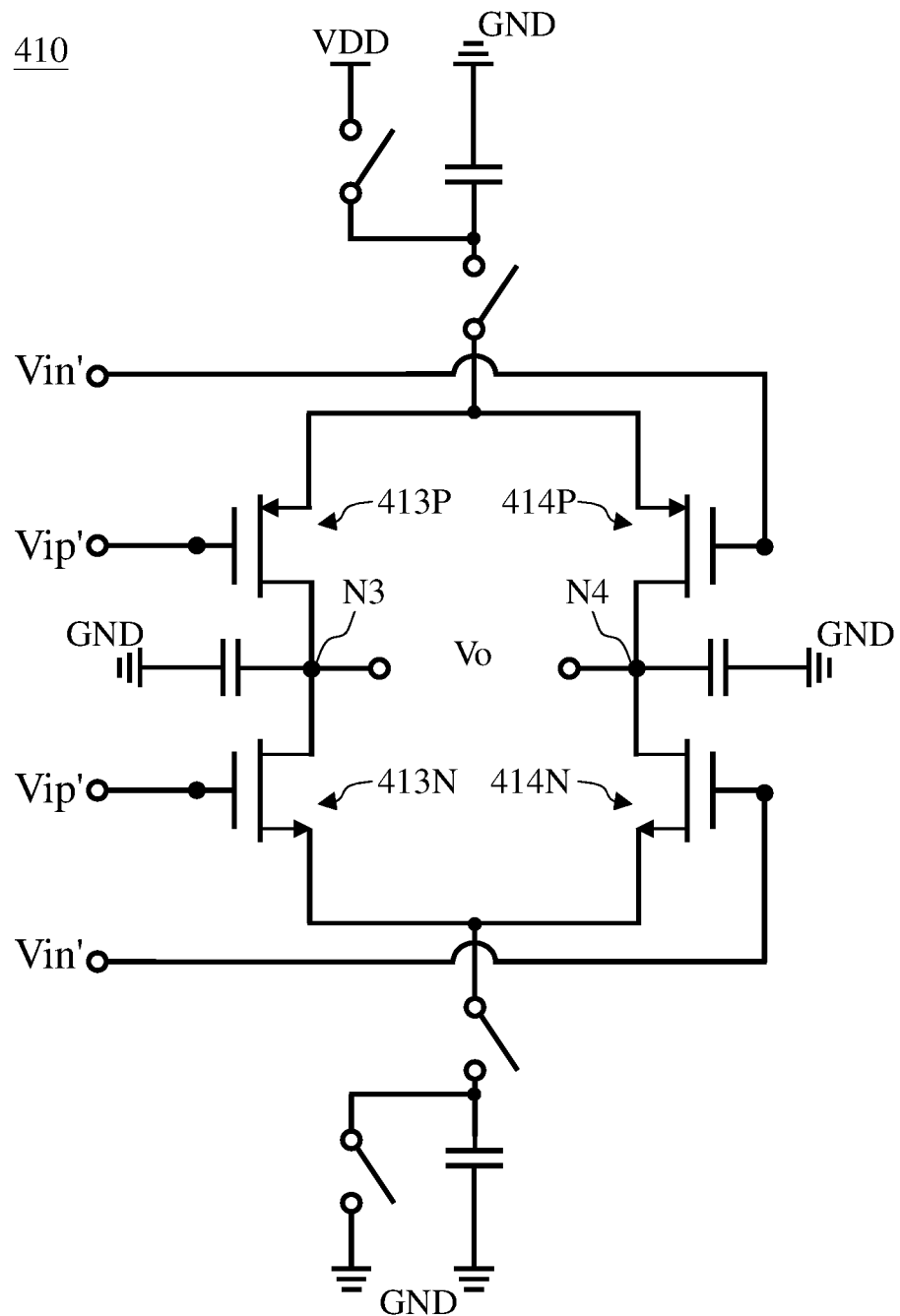
FIG. 9 illustrates a circuit diagram of a charge-steering amplifier according to another embodiment.

In other embodiments, the charge-steering amplifier 210 of FIG. 2 may be replaced by the charge-steering amplifier 310 of FIG. 8 or the charge-steering amplifier 410 of FIG. 9. The charge-steering amplifier 310 is a charge-steering amplifier embodied by the P-channel MOSFETs (hereinafter referred to as a PMOS transistors) (namely, the transistor 313 and the transistor 314 are the PMOS transistors), and the charge-steering amplifier 410 is a charge-steering amplifier embodied by both the PMOS transistors (i.e., the transistor 413P and the transistor 414P) and the NMOS transistors (i.e., the transistor 413N and the transistor 414N). As shown in FIG. 8, the output terminal N3 and the output terminal N4 are the drains of the transistor 313 and the transistor 314, respectively. As shown in FIG. 9, the output terminal N3 is the drain of the transistor 413P and the transistor 413N, and the output terminal N4 is the drain of the transistor 414P and the transistor 414N.

The operating principles of the charge-steering amplifier 310 and the charge-steering amplifier 410 are known to people having ordinary skill in the art and thus omitted for brevity.

Figure 10:
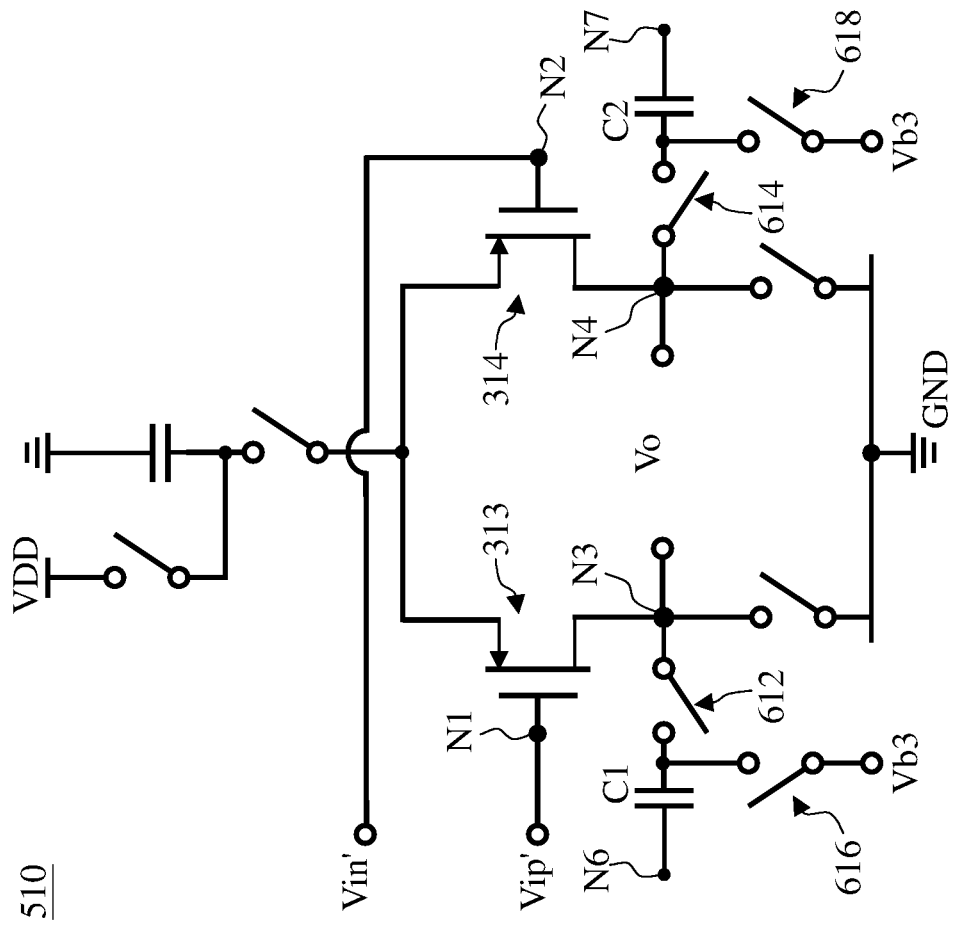
FIG. 10 illustrates a circuit diagram of a charge-steering amplifier according to another embodiment.
Figure 11:
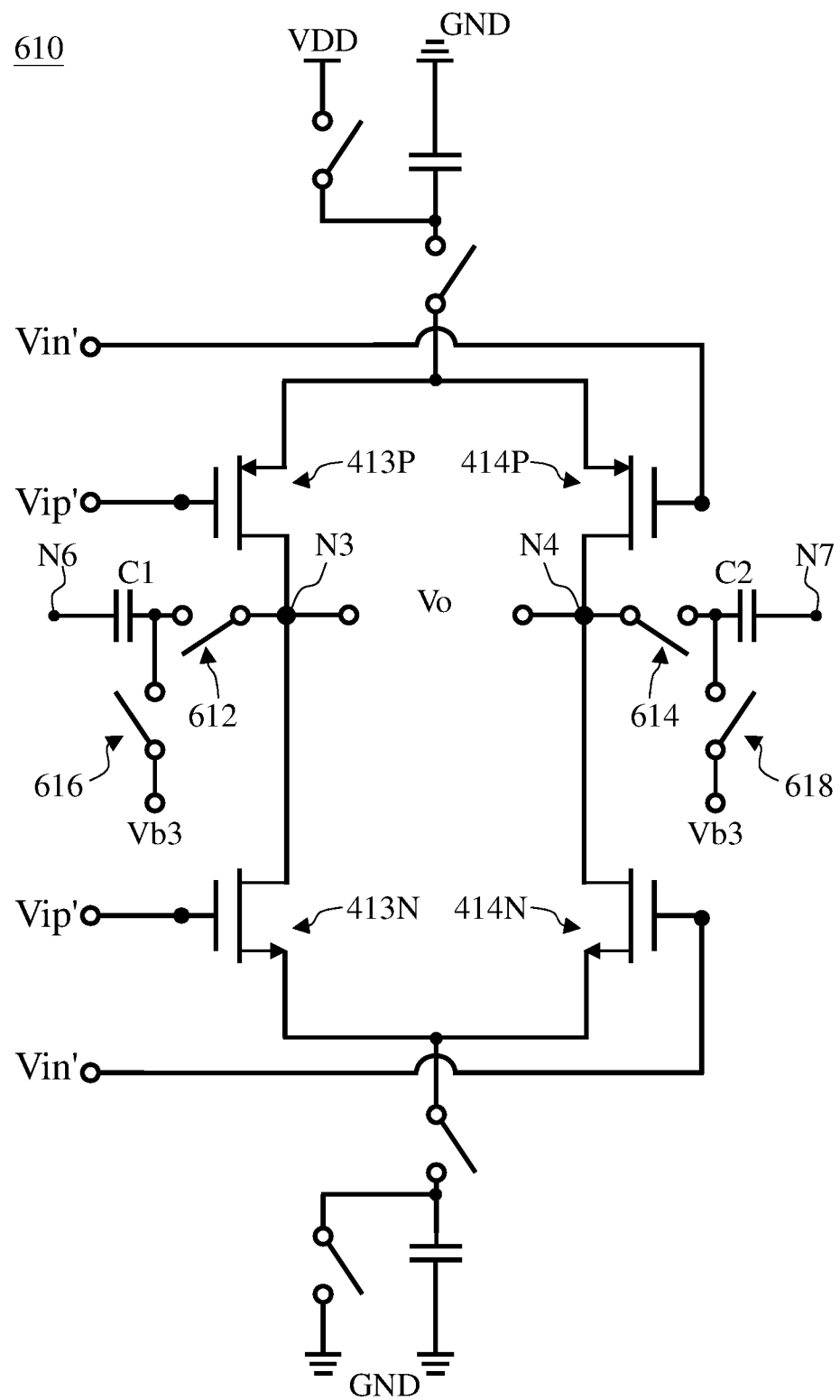
FIG. 11 illustrates a circuit diagram of a charge-steering amplifier according to another embodiment.

In other embodiments, the charge-steering amplifier 610 of FIG. 6 may be replaced by the charge-steering amplifier 510 of FIG. 10 or the charge-steering amplifier 610 of FIG. 11. The charge-steering amplifier 510 and the charge-steering amplifier 610 are similar to the charge-steering amplifier 310 and the charge-steering amplifier 410, respectively, and the details are thus omitted for brevity.

To sum up, the present invention extracts the common-mode voltage of the differential input signal and provides the common-mode voltage to the output terminals of the charge-steering amplifier (i.e., the drain of the transistors, namely, one end of the load capacitors) or one end of the load capacitors. In this way, the output terminals of the charge-steering amplifier can track the common-mode voltage of the differential input signal, thereby reducing the negative impacts of the perturbation of the common-mode voltage on the charge-steering amplifier circuit and improving the linearity of the gain of the charge-steering amplifier circuit.

Since a person having ordinary skill in the art can appreciate the implementation detail and the modification thereto of the present method invention through the disclosure of the device invention, repeated and redundant description is thus omitted. Please note that the shape, size, and ratio of any element in the disclosed figures are exemplary for understanding, not for limiting the scope of this invention. Furthermore, there is no step sequence limitation for the method inventions as long as the execution of each step is applicable. In some instances, the steps can be performed simultaneously or partially simultaneously.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A charge-steering amplifier circuit for amplifying a differential input signal, comprising:
   a sample-and-hold circuit configured to sample the differential input signal to generate a first sampled signal and a second sampled signal;
   a charge-steering amplifier coupled to the sample-and-hold circuit and having a first input terminal, a second input terminal, a first output terminal, and a second output terminal, wherein the first input terminal receives the first sampled signal, and the second input terminal receives the second sampled signal;
   a reference voltage generation circuit configured to generate a reference voltage according to the differential input signal, the reference voltage being an operation result of a common-mode voltage of the differential input signal and a direct current (DC) voltage; and
   a switch circuit coupled to the charge-steering amplifier and the reference voltage generation circuit and configured to couple the reference voltage to the first output terminal and the second output terminal.

2. The charge-steering amplifier circuit of claim 1, wherein the switch circuit comprises:
   a first switch coupled between the reference voltage generation circuit and the first output terminal; and
   a second switch coupled between the reference voltage generation circuit and the second output terminal.

3. The charge-steering amplifier circuit of claim 2, wherein the charge-steering amplifier circuit operates in a reset phase or an amplification phase, and the charge-steering amplifier amplifies the first sampled signal and the second sampled signal in the amplification phase, the sample-and-hold circuit samples the differential input signal in the reset phase, and the first switch and the second switch are turned on in the reset phase.

4. A control method of a charge-steering amplifier circuit which comprises a charge-steering amplifier and a sample-and-hold circuit, the charge-steering amplifier circuit operating in a reset phase or an amplification phase, the charge-steering amplifier performing an amplification operation on a first sampled signal and a second sampled signal in the amplification phase, the method comprising:
   obtaining a common-mode voltage of a differential input signal in the reset phase;
   providing the common-mode voltage and a direct current (DC) voltage to an output terminal of the charge-steering amplifier in the reset phase;
   using the sample-and-hold circuit to sample the differential input signal to generate the first sampled signal and the second sampled signal in the reset phase; and
   inputting the first sampled signal and the second sampled signal to the charge-steering amplifier in the amplification phase.

5. A charge-steering amplifier circuit for amplifying a differential input signal, comprising:

a sample-and-hold circuit configured to sample the differential input signal to generate a first sampled signal and a second sampled signal;
a charge-steering amplifier coupled to the sample-and-hold circuit and comprising:
  a first input terminal configured to receive the first sampled signal;
  a second input terminal configured to receive the second sampled signal;
  a first output terminal;
  a second output terminal;
  a first switch;
  a second switch;
  a third switch;
  a fourth switch;
  a first load capacitor having a first end and a second end, wherein the first end is coupled to the first output terminal through the first switch and coupled to a first reference voltage through the second switch; and
  a second load capacitor having a third end and a fourth end, wherein the third end is coupled to the second output terminal through the third switch and coupled to the first reference voltage through the fourth switch;
a common-mode voltage generation circuit configured to generate a common-mode voltage of the differential input signal according to the differential input signal; and a switch circuit coupled to the charge-steering amplifier and the common-mode voltage generation circuit and configured to couple the second end and the fourth end to the common-mode voltage or a second reference voltage.

6. The charge-steering amplifier circuit of claim 5, wherein the switch circuit comprises:
  a fifth switch configured to couple the second end to the common-mode voltage;
  a sixth switch configured to couple the fourth end to the common-mode voltage;
  a seventh switch configured to couple the second end to the second reference voltage; and
  an eighth switch configured to couple the fourth end to the second reference voltage.

7. The charge-steering amplifier circuit of claim 6, wherein the charge-steering amplifier circuit operates in a reset phase or an amplification phase, the charge-steering amplifier amplifies the first sampled signal and the second sampled signal in the amplification phase, the sample-and-hold circuit samples the differential input signal in the reset phase, the first switch, the third switch, the fifth switch, and the sixth switch are turned on in the amplification phase and turned off in the reset phase, and the second switch, the fourth switch, the seventh switch, and the eighth switch are turned off in the amplification phase and turned on in the reset phase.

* * * * *